United States Patent
Taracila et al.

(10) Patent No.: US 10,209,328 B2
(45) Date of Patent: Feb. 19, 2019

(54) SYSTEMS AND METHODS FOR COMMON MODE TRAPS IN MRI SYSTEMS

(71) Applicant: General Electric Company, Schenectady, NY (US)

(72) Inventors: Victor Taracila, Beachwood, OH (US); Robert Steven Stormont, Hartland, WI (US); Fraser John Laing Robb, Aurora, OH (US); Louis Jay Vannatta, Crystal Lake, IL (US)

(73) Assignee: General Electric Company, Schenectady, NY (US)

( * ) Notice: Subject to any disclaimer, the term of this patent is extended or adjusted under 35 U.S.C. 154(b) by 178 days.

(21) Appl. No.: 15/391,437

(22) Filed: Dec. 27, 2016

(65) Prior Publication Data

US 2017/0343628 A1    Nov. 30, 2017

Related U.S. Application Data

(63) Continuation-in-part of application No. 15/166,636, filed on May 27, 2016.

(51) Int. Cl.
*G01V 3/00* (2006.01)
*G01R 33/36* (2006.01)
(Continued)

(52) U.S. Cl.
CPC ....... *G01R 33/3685* (2013.01); *G01R 33/307* (2013.01); *G01R 33/385* (2013.01); *G01R 33/543* (2013.01); *G01R 33/546* (2013.01)

(58) Field of Classification Search
CPC .............. G01R 33/5608; G01R 33/543; G01R 33/3815; G01R 33/3804; A61B 5/055
(Continued)

(56) References Cited

U.S. PATENT DOCUMENTS 4,109,223 A    8/1978 Tenkman et al.
5,015,204 A    5/1991 Sakamoto et al.
(Continued)

OTHER PUBLICATIONS

Stormont, R. et al., "Systems and Methods for MRI Common Mode Traps," U.S. Appl. No. 14/730,741, filed Jun. 4, 2015, 33 pages.
(Continued)

*Primary Examiner* — Walter L Lindsay, Jr.
*Assistant Examiner* — Frederick Wenderoth
(74) *Attorney, Agent, or Firm* — McCoy Russell LLP

(57) ABSTRACT

Various methods and systems are provided for a common mode trap for a magnetic resonance imaging (MRI) apparatus. In one embodiment, a common mode trap comprises: a first conductor and a second conductor counterwound around a length of a central conductor, the first and the second conductors radially spaced a distance from the central conductor, the first and second conductors fixed to a first side of the central conductor; and a third conductor and a fourth conductor counterwound around the length of the central conductor, the third and fourth conductors are radially spaced the distance from the central conductor, the third and fourth conductors fixed to a second side of the central conductor opposite the first side. In this way, the density of common mode trap conductors in a common mode trap may be increased, thereby increasing the mutual inductance between the common mode trap and the central conductor.

20 Claims, 9 Drawing Sheets

(51) Int. Cl.
    *G01R 33/385*     (2006.01)
    *G01R 33/30*     (2006.01)
    *G01R 33/54*     (2006.01)

(58) Field of Classification Search
    USPC .................................. 324/322; 333/219–235
    See application file for complete search history.

(56) References Cited

U.S. PATENT DOCUMENTS

| | | | |
|---|---|---|---|
| 5,195,232 | A | 3/1993 | Frederick |
| 5,744,755 | A | 4/1998 | Gasque, Jr. |
| 6,033,593 | A | 3/2000 | Onizuka et al. |
| 6,456,182 | B1 | 9/2002 | Katayama et al. |
| 8,588,938 | B2 * | 11/2013 | Lloyd .................. A61B 5/0422 |
| | | | 607/116 |
| 9,642,670 | B2 | 5/2017 | Johnson et al. |
| 2005/0219006 | A1 | 10/2005 | Suenaga et al. |
| 2005/0270031 | A1 | 12/2005 | Oppelt et al. |
| 2006/0181398 | A1 | 8/2006 | Martich et al. |
| 2006/0181459 | A1 | 8/2006 | Aekins et al. |
| 2008/0051854 | A1 | 2/2008 | Bulkes et al. |
| 2008/0136415 | A1 | 6/2008 | de Rooij et al. |
| 2008/0243218 | A1 | 10/2008 | Bottomley et al. |
| 2008/0262584 | A1 | 10/2008 | Bottomley et al. |
| 2009/0021261 | A1 | 1/2009 | Chmielewski et al. |
| 2010/0174348 | A1 | 7/2010 | Bulkes et al. |
| 2010/0218970 | A1 | 9/2010 | Eshima |
| 2010/0329527 | A1 | 12/2010 | Iannotti et al. |
| 2013/0069615 | A1 | 3/2013 | Choi et al. |
| 2014/0154920 | A1 | 6/2014 | Dinh et al. |
| 2015/0008926 | A1 | 1/2015 | Yang et al. |
| 2015/0018917 | A1 | 1/2015 | Wechter et al. |
| 2015/0108983 | A1 | 4/2015 | Chang et al. |
| 2015/0119871 | A1 | 4/2015 | Johnson et al. |
| 2015/0200645 | A1 | 7/2015 | Waks et al. |
| 2015/0206646 | A1 | 7/2015 | Dinh et al. |
| 2016/0127157 | A1 | 5/2016 | Wojnowski et al. |
| 2017/0178783 | A1 | 6/2017 | Lou et al. |

OTHER PUBLICATIONS

United States Patent and Trademark Office, Office Action Issued in U.S. Appl. No. 15/166,636, Sep. 27, 2018, 25 pages.

* cited by examiner

SYSTEMS AND METHODS FOR COMMON MODE TRAPS IN MRI SYSTEMS

CROSS REFERENCE TO RELATED APPLICATIONS

The present application is a continuation-in-part of U.S. application Ser. No. 15/166,636, entitled "SYSTEMS AND METHODS FOR COMMON MODE TRAPS IN MRI SYSTEMS", filed on May 27, 2016. The entire contents of the above application are hereby incorporated by reference in its entirety for all purposes.

FIELD

Embodiments of the subject matter disclosed herein relate to magnetic resonance imaging (MRI), and more particularly, to common mode traps for an MRI system.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using a computer and known reconstruction algorithms.

As mentioned, RF coils are used in MRI systems to transmit RF excitation signals and to receive MR signals, the RF signals emitted by an imaging subject. Coil interfacing cables may be used to transmit signals between the RF coils and other aspects of the processing system, for example to control the RF coils and/or to receive information from the RF coils. The coil interfacing cables may be disposed within the bore of the MRI system and subjected to electromagnetic fields produced and used by the MRI system. The cables may support transmitter-driven common mode currents which create field distortions and/or unpredictable heating of components. These field distortions may result in a shadow of the cables appearing within an image reconstructed from received MR signals.

Conventionally, baluns or common mode traps that provide high common mode impedances may be utilized to mitigate the effect of transmitter-driven currents. However, placing the common mode traps or blocking circuits at appropriate locations may be difficult, as the appropriate placement may vary based on the positioning of a cable or coil associated with the common mode traps. Also, excessive voltage and/or power dissipation may occur even if conventional common mode traps or blocking circuits are placed at appropriate locations.

Further, baluns or common mode traps positioned too close to each other on a cable may become coupled due to fringe magnetic fields, thereby resulting in a detuning of the baluns which may adversely affect the functioning of the baluns.

BRIEF DESCRIPTION

In one embodiment, a common mode trap for a magnetic resonance imaging (MRI) apparatus comprises: a first conductor and a second conductor counterwound around a length of a central conductor, wherein the first and the second conductors are radially spaced a first distance from the central conductor, wherein the first and second conductors are fixed to a first side of the central conductor; and a third conductor and a fourth conductor counterwound around the length of the central conductor, wherein the third and fourth conductors are radially spaced the first distance from the central conductor, and wherein the third and fourth conductors are fixed to a second side of the central conductor opposite the first side. In this way, the density of common mode trap conductors in a common mode trap may be increased, thereby increasing the mutual inductance between the common mode trap and the central conductor disposed therein.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 7:
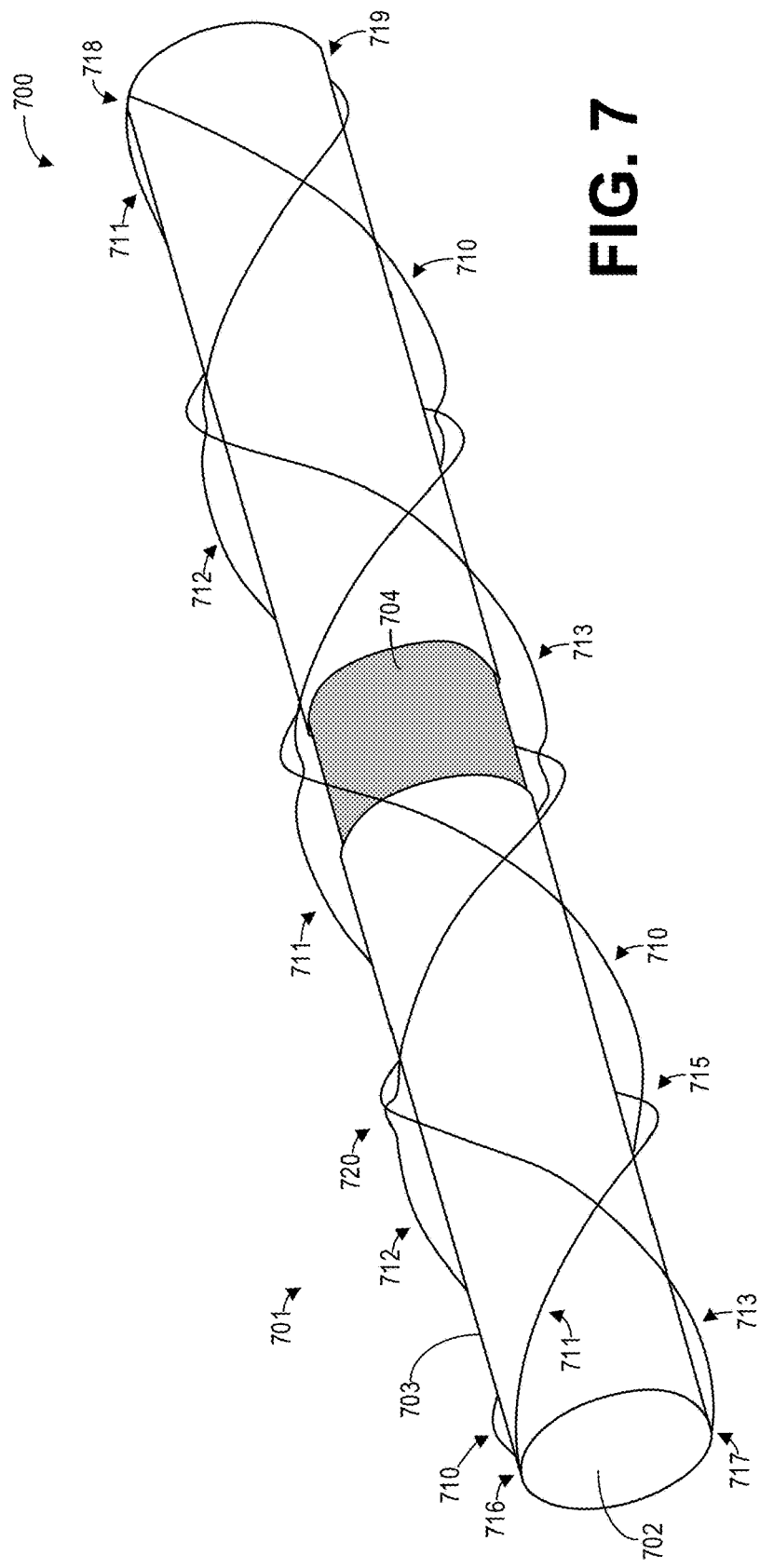
FIG. 7 is a perspective view of a common mode trap with four common mode trap conductors on a straight cable according to an embodiment of the invention.
Figure 8:
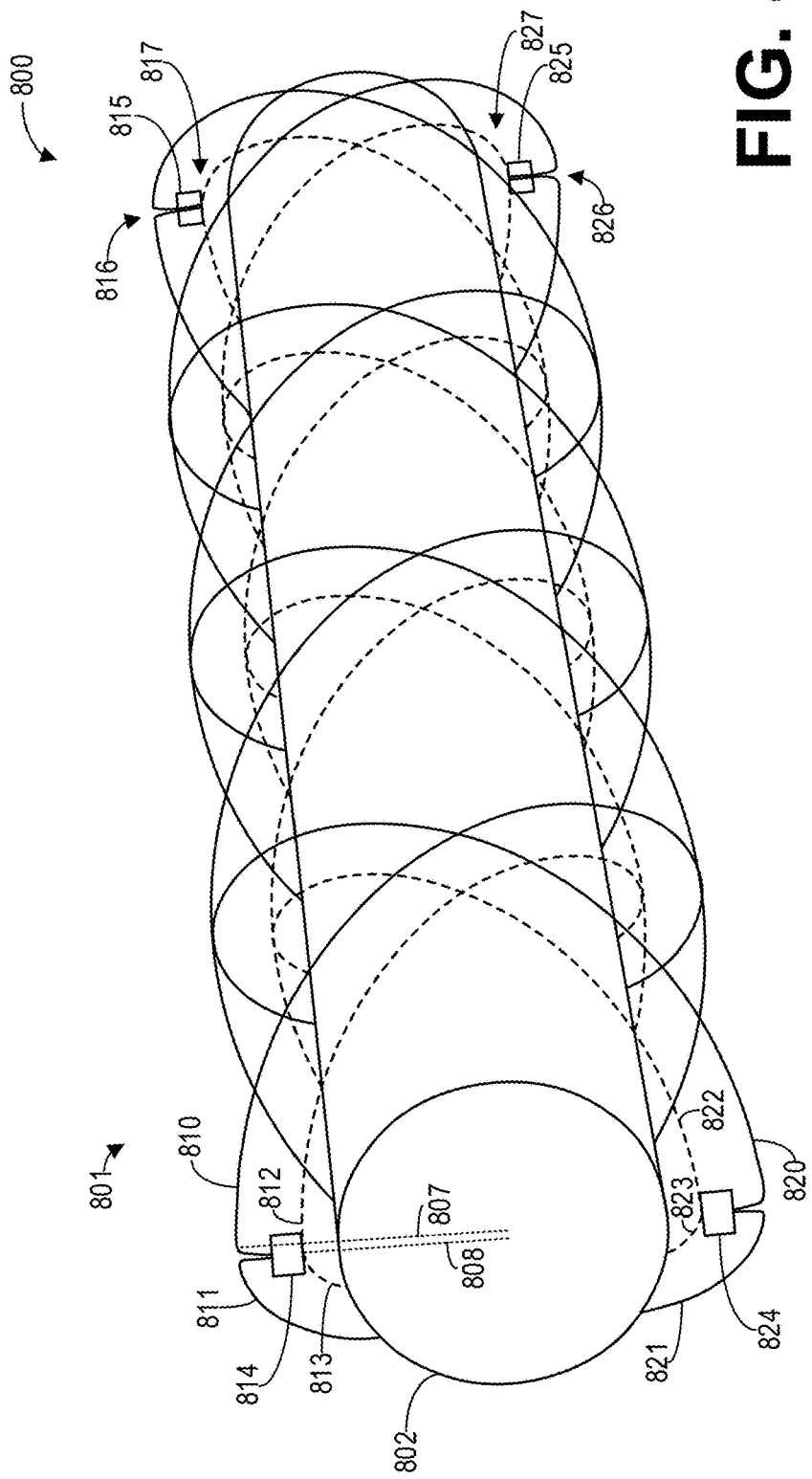
FIG. 8 is a perspective view of a common mode trap with eight common mode trap conductors on a straight cable.
Figure 9:
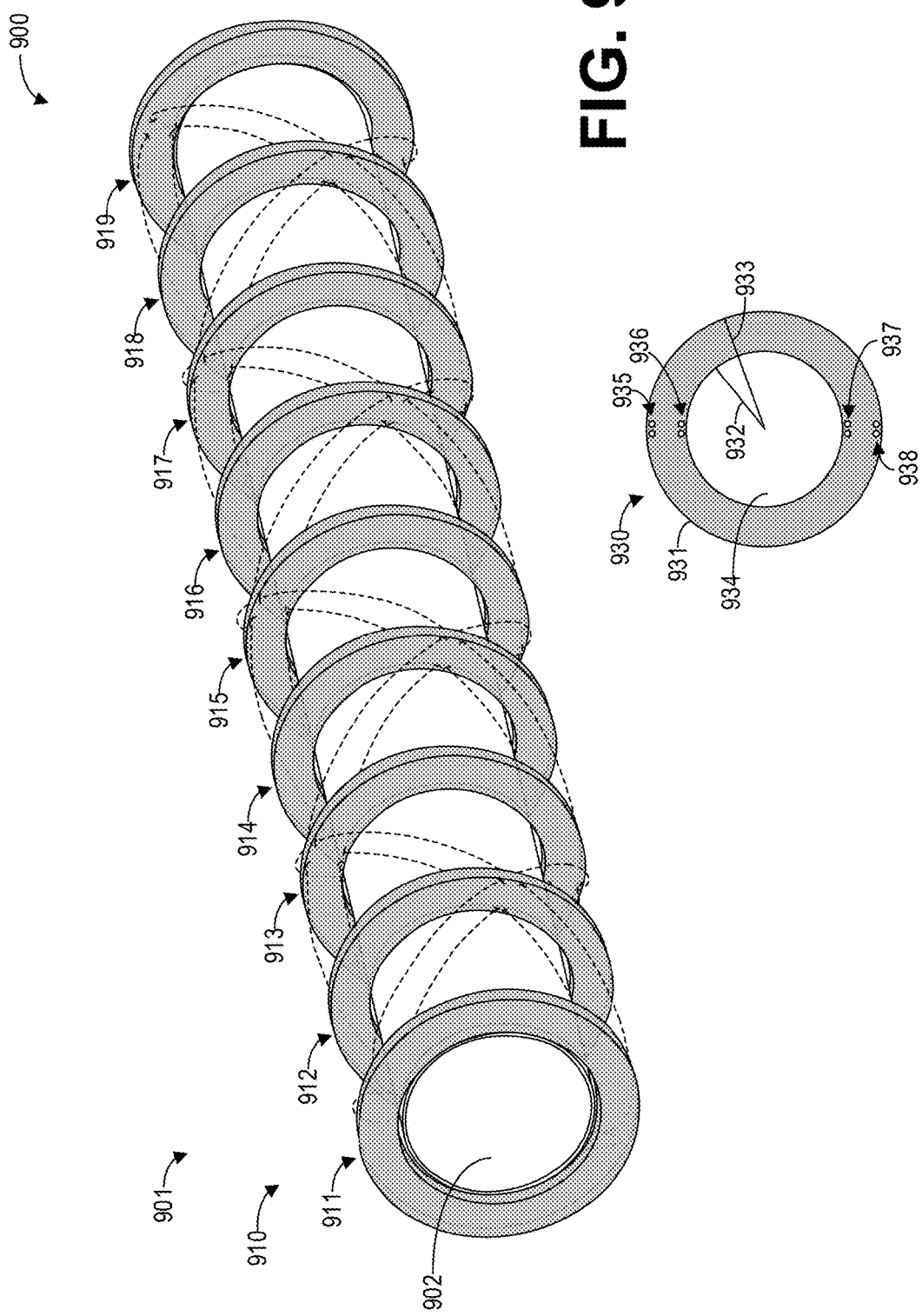
FIG. 9 is a perspective view of a common mode trap with eight common mode trap conductors supported by washers on a curved cable according to an embodiment of the invention.
Figure 10:
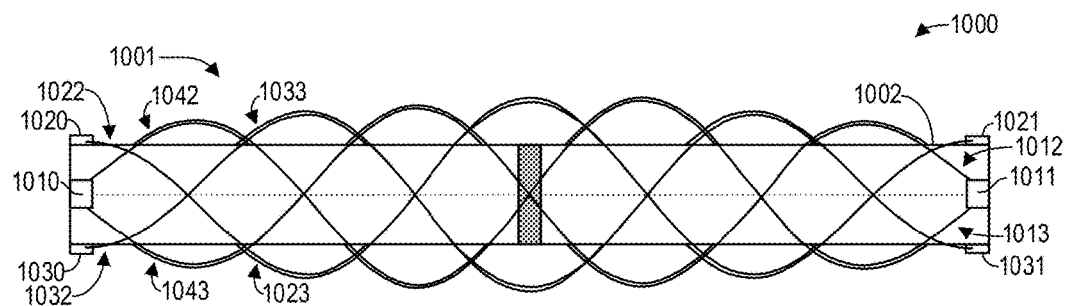
FIG. 10 is a top view of a common mode trap with eight common mode trap conductors on a straight cable according to an embodiment of the invention.
Figure 11:
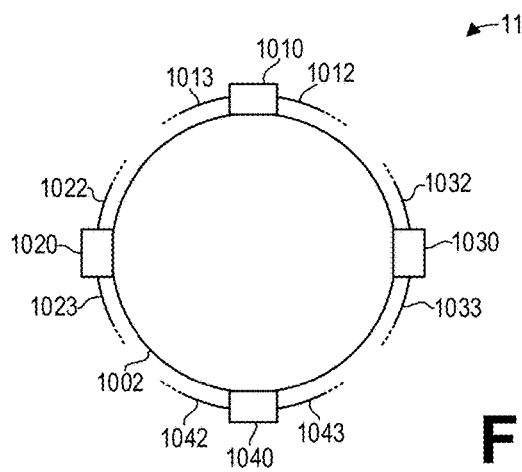
FIG. 11 is a cross-sectional view of the common mode trap of FIG. 10 according to an embodiment of the invention.
Figure 12:
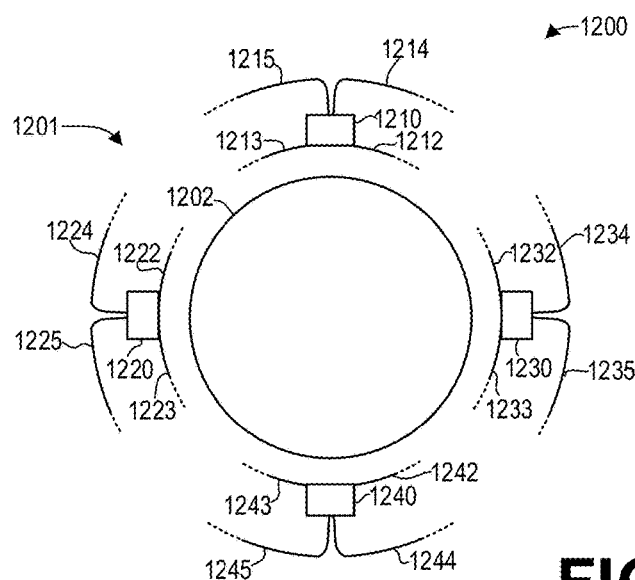
FIG. 12 is a cross-sectional view of a common mode trap with sixteen common mode trap conductors according to an embodiment of the invention.
Figure 13:
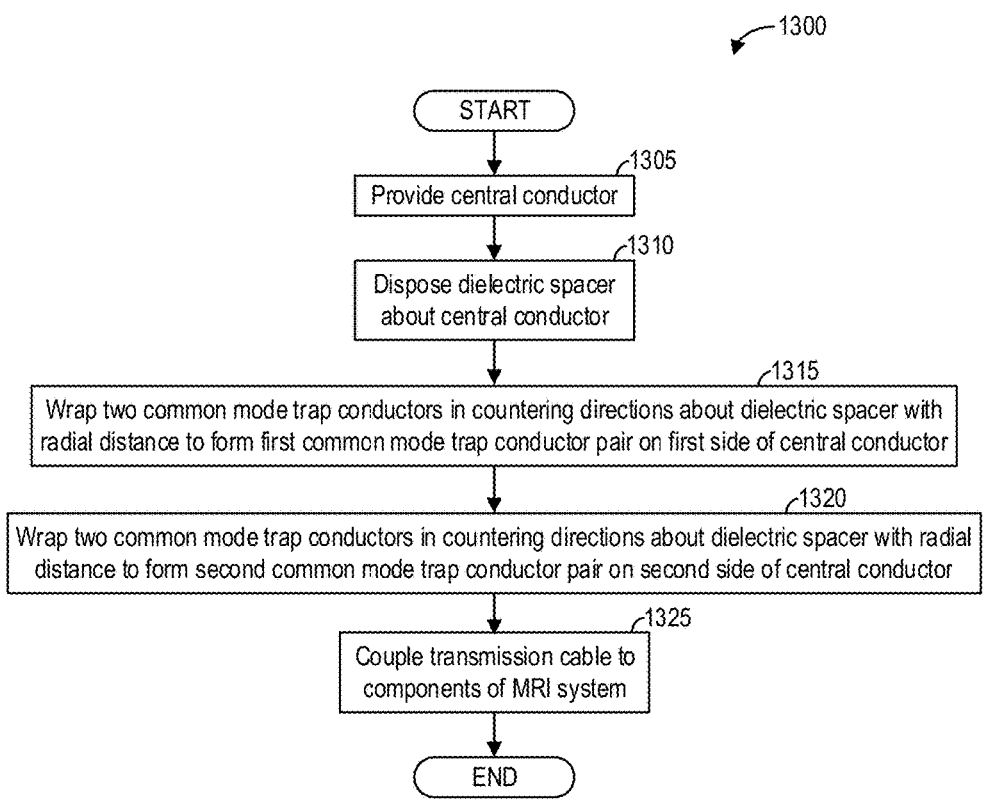
FIG. 13 is a high-level block diagram illustrating an example method for a common mode trap with four common mode trap conductors according to an embodiment of the invention.
Figure 14:
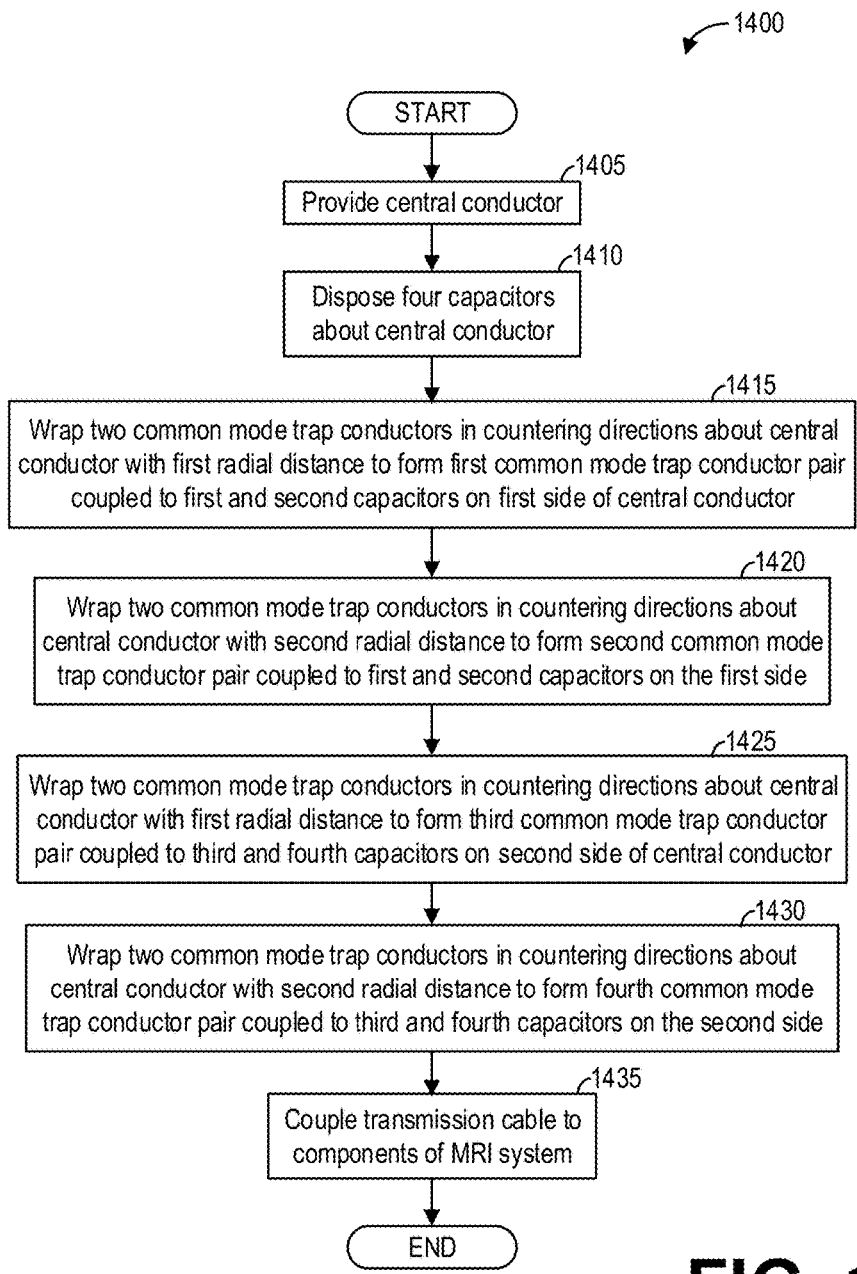
FIG. 14 is a high-level block diagram illustrating an example method for a common mode trap with eight common mode trap conductors according to an embodiment of the invention.

The following description relates to various embodiments of a common mode trap for MRI systems. In particular, systems are provided for a high-density spiral configurations in a common mode trap assembly for an MRI system, such as the MRI system depicted in FIG. 1. As shown in FIG. 2, a common mode trap assembly comprising a plurality of common mode traps may be placed on a cable for communicating received MR data. FIGS. 3-6 show various views of a common mode trap with two counterwound common mode trap conductors. In different embodiments, common mode traps may include more than two counterwound common mode trap conductors. For example, FIG. 7 shows a common mode trap with four counterwound common mode trap conductors. As another example, FIG. 8 shows a common mode trap with eight counterwound common mode trap conductors. With the increased complexity of the common mode trap configuration, various methods may be utilized for mechanically supporting and maintaining the configuration of common mode trap conductors. For example, FIG. 9 shows a plurality of washers that support the common mode trap conductors. FIGS. 10 and 11 illustrate another approach for arranging eight common mode trap conductors on a common mode trap. FIG. 12 shows a common mode trap with sixteen counterwound common mode trap conductors. FIGS. 13 and 14 illustrate example methods for constructing high-density common mode traps.

Figure 1:
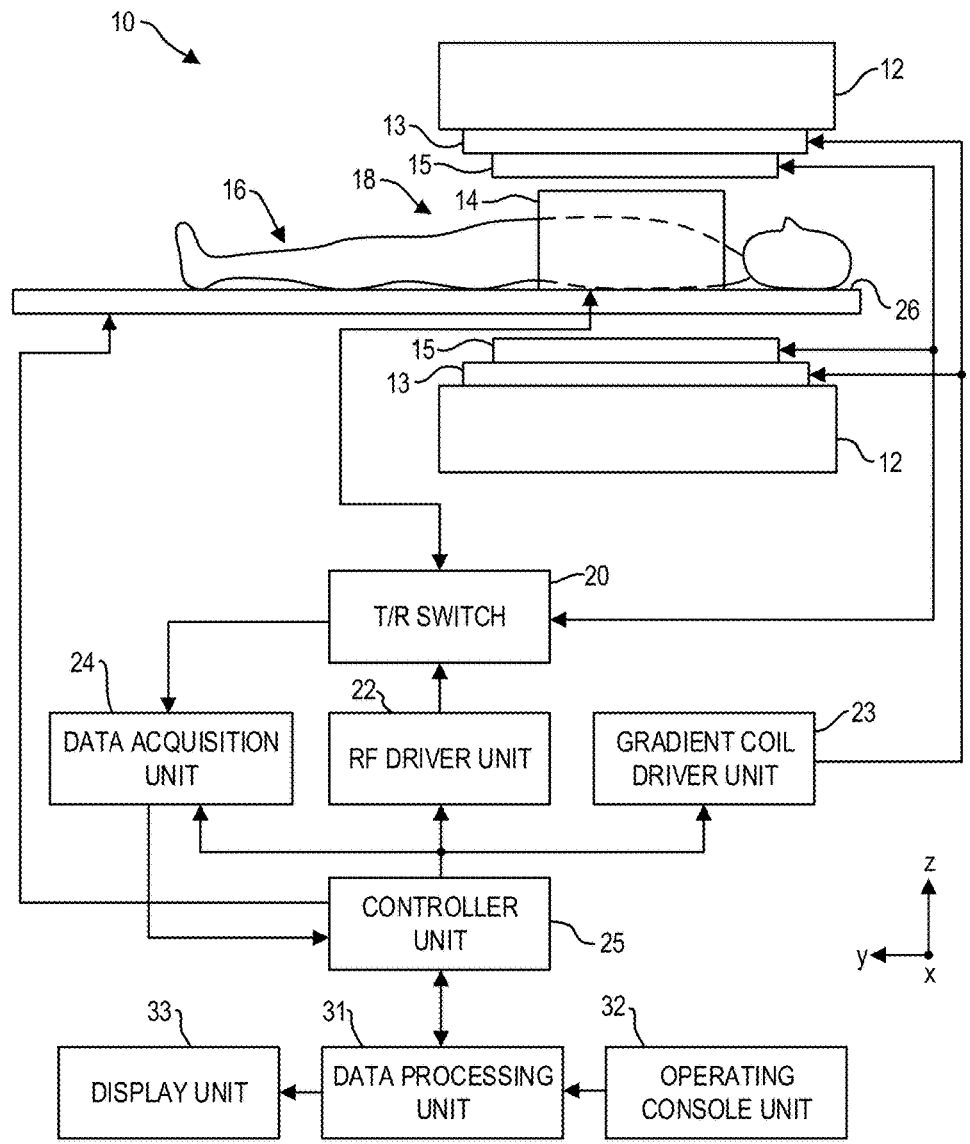
FIG. 1 is a block diagram of an MRI system according to an embodiment of the invention.
Figure 2:
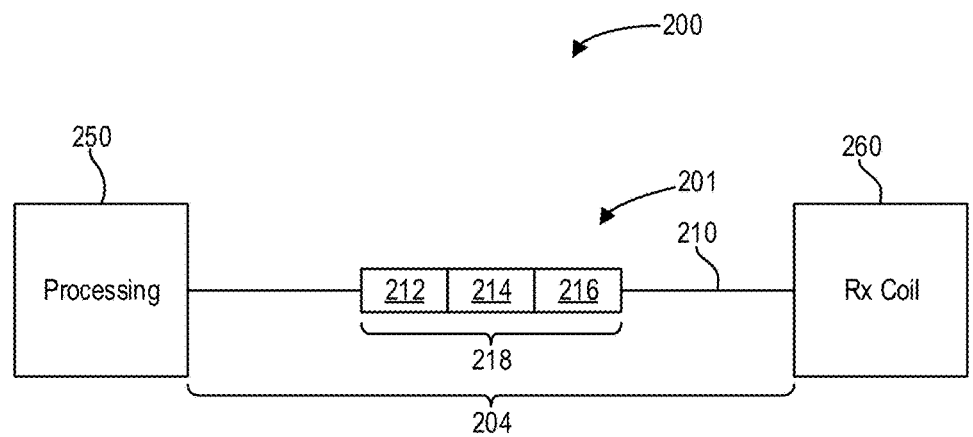
FIG. 2 is a block diagram illustrating a continuous common mode trap assembly according to an embodiment of the invention.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance signals from the subject 16 to reconstruct an image of the slice of the subject 16 based on the magnetic resonance signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field along the Z direction of the cylinder space.

The MRI apparatus 10 also includes a gradient coil unit 13 that forms a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject 16, to select the slice; and the RF coil unit 14 transmits an RF pulse to a selected slice of the subject 16 and excites it. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In the static magnetic field space or imaging space 18 where a static magnetic field is formed by the magnetostatic field magnet unit 12, the RF coil unit 14 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses orthogonal to the main magnetic field produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MR apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil units may be utilized for different scanning objectives. To that end, the RF coil unit 14 may be disconnected from the MRI apparatus 10, so that a different RF coil unit may be connected to the MRI apparatus 10. The RF coil unit 14 may be coupled to the T/R switch 20, and thus to the RF driver unit 22 and the data acquisition unit 24, via a connector 17 and an RF port interface 21. Specifically, the connector 17 may be plugged into the RF port interface 21 to electronically couple the RF coil unit 14 to the T/R switch 20. Using a single connector 17, fixedly attached to the RF coil unit 14, enables easy interchangeability of RF coil units.

During a scan, coil interfacing cables (not shown) may be used to transmit signals between the RF coils (e.g., RF coil unit 14) and other aspects of the processing system (e.g., data acquisition unit 24, controller unit 25, and so on), for example to control the RF coils and/or to receive information from the RF coils. The coil interfacing cables may be disposed within the bore or imaging space 18 of the Mill apparatus 10 and subjected to electro-magnetic fields produced and used by the MRI apparatus 10. The cables may support transmitter driven common mode currents which create field distortions and/or unpredictable heating of components. Baluns or common mode traps that provide high common mode impedances may be utilized to mitigate the effect of transmitter driven currents. Various embodiments of such common mode traps and common mode trap assemblies are described further herein.

FIG. 2 illustrates a block schematic diagram of a continuous common mode trap assembly 200 formed in accordance with various embodiments. The common mode trap assembly 200 may be configured, for example, for use in the bore of an MRI system, such as the MRI apparatus 10 described herein above. For example, in the illustrated embodiment, the common mode trap assembly 200 is configured as a transmission cable 201 configured for transmission of signals between a processing unit (or controller) 250 and a receive coil 260 of an MRI system. In the illustrated embodiment, the transmission cable 201 (or common mode trap assembly 200) includes a central conductor 210 and plural common mode traps 212, 214, 216. It may be noted that, while the common mode traps 212, 214, and 216 are depicted as distinct from the central conductor 210, in some embodiments, the common mode traps 212, 214, 216 may be integrally formed with or as a part of the central conductor 210.

The central conductor 210 in the illustrated embodiment has a length 204, and is configured to transmit a signal between the MRI receive coil 260 and at least one processor of an MRI system (e.g., processing unit 250). The central conductor 210 may include one or more of a ribbon conductor, a wire, or a coaxial cable bundle, for example. The length 204 of the depicted central conductor 210 extends from a first end of the central conductor 210 (which is coupled to the processing unit 250) to a second end of the central conductor 210 (which is coupled to the MRI receive coil 260). In some embodiments, the central conductor may pass through a central opening of the common mode traps 212, 214, 216.

The depicted common mode traps 212, 214, 216 (which may be understood as cooperating to form a common mode trap unit 218), as seen in FIG. 2, extend along at least a portion of the length 204 of the central conductor 210. In the illustrated embodiment, common mode traps 212, 214, 216 do not extend along the entire length 204. However, in other embodiments, the common mode traps 212, 214, 216 may extend along the entire length 204, or substantially along the entire length 204 (e.g., along the entire length 204 except for portions at the end configured to couple, for example, to a processor or receive coil). The common mode traps 212, 214, 216 are disposed contiguously. As seen in FIG. 2, each of the common mode traps 212, 214, 216 is disposed contiguously to at least one other of the common mode traps 212, 214, 216. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than $1/40^{th}$ of a wavelength of a transmit frequency in free space. In some embodiments, an insubstantial gap (or conductor length) may be understood as being two centimeters or less. Contiguous common mode traps, for example, have no (or insubstantial) intervening gaps or conductors therebetween that may be susceptible to induction of current from a magnetic field without mitigation provided by a common mode trap. For example, as depicted in FIG. 1, the common mode trap 212 is contiguous to the common mode trap 214, the common mode trap 214 is contiguous to the common mode trap 212 and the common mode trap 216 (and is interposed between the common mode trap 212 and the common mode trap 216), and the common mode trap 216 is contiguous to the common mode trap 214. Each of the common mode traps 212, 214, 216 are configured to provide an impedance to the receive transmitter driven currents of an MRI system. The common mode traps 212, 214, 216 in various embodiments provide high common mode impedances. Each common mode trap 212, 214, 216, for example, may include a resonant circuit and/or one or more resonant components to provide a desired impedance at or near a desired frequency or within a target frequency range. It may be noted that the common mode traps 212, 214, 216 and/or common mode trap unit 218 may also be referred to as chokes or baluns by those in the art.

In contrast to systems having separated discrete common mode traps with spaces therebetween, various embodiments (e.g., the common mode trap assembly 200) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common mode trap unit 218) may extend along a length or portion thereof of a transmission cable. The continuous mode trap portion may be formed of contiguously joined individual common mode traps or trap sections (e.g., common mode traps 212, 214, 216). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 212, 214, 216) in various embodiments may be constructed or formed generally similarly to each other (e.g., each trap may be a section of a length of tapered wound coils), but each individual trap or section may be configured slightly differently than other traps or sections. For example, in some embodiments, each common mode trap 212, 214, 216 is tuned independently. Accordingly, each common mode trap 212, 214, 216 may have a resonant frequency that differs from other common mode traps of the same common mode trap assembly 200.

Alternatively or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to the operating frequency to provide on-frequency blocking, or to provide a blocking impedance at the operating frequency.

Further additionally or alternatively, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

In various embodiments, the common mode traps may have a two or three-dimensional butterfly configuration to counteract magnetic field coupling and/or local distortions.

Figure 3:
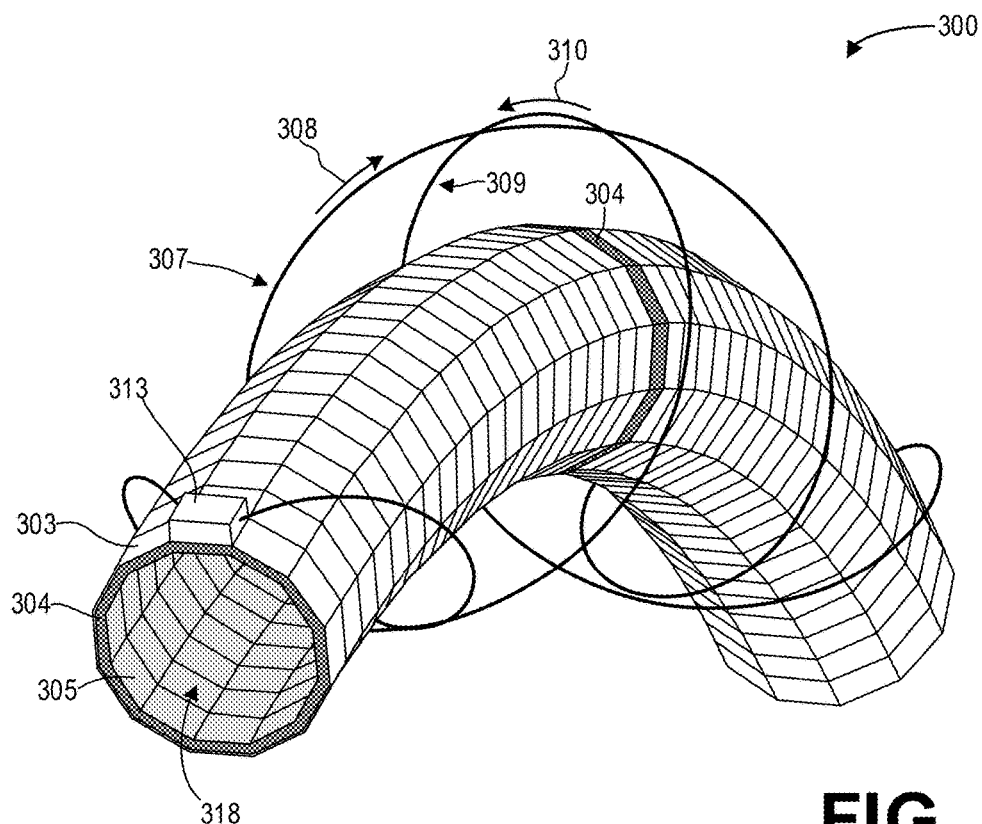
FIG. 3 is a perspective view of a common mode trap with two common mode trap conductors.

FIG. 3 is a perspective view of a common mode trap 300 with two counterwound common mode trap conductors. The common mode trap 300 includes an outer sleeve or shield 303, a dielectric spacer 304, an inner sleeve 305, a first common mode trap conductor 307, and a second common mode trap conductor 309.

The first common mode trap conductor 307 is wrapped in a spiral about the dielectric spacer 304, or wrapped in a spiral at a tapering distance from a central conductor (not shown) disposed within the bore 318 of the common mode trap 300, in a first direction 308. Further, the second common mode trap conductor 309 is wrapped in a spiral about the dielectric spacer 304, or wrapped in a spiral at a tapering distance from the central conductor disposed within the bore 318, in a second direction 310 that is opposite to the first direction 308. In the illustrated embodiment, the first direction 308 is clockwise and the second direction 310 is counter-clockwise.

The conductors 307 and 309 of the common mode trap 300 may comprise electrically-conductive material (e.g., metal) and may be shaped as ribbons, wires, and/or cables, for example. In some embodiments, the counterwound or outer conductors 307 and 309 may serve as a return path for a current passing through the central conductor. Further, in various embodiments, the counterwound conductors 307 and 309 may cross each other orthogonally (e.g., a center line or path defined by the first common mode trap conductor 307 is perpendicular to a center line or path defined by the second common mode trap conductor 309 as the common mode trap conductors cross paths) to eliminate, minimize, or reduce coupling between the common mode trap conductors.

It may be further noted that in various embodiments the first common mode trap conductor 307 and the second common mode trap conductor 309 are loosely wrapped about the dielectric spacer 304 to provide flexibility and/or to reduce any binding, coupling, or variation in inductance when the common mode trap 300 is bent or flexed. It may be noted that the looseness or tightness of the counterwound outer conductors may vary by application (e.g., based on the relative sizes of the conductors and dielectric spacer, the amount of bending or flexing that is desired for the common mode trap, or the like). Generally, the outer or counterwound conductors should be tight enough so that they remain in the same general orientation about the dielectric spacer 304, but loose enough to allow a sufficient amount of slack or movement during bending or flexing of the common mode trap 300 to avoid, minimize, or reduce coupling or binding of the counterwound outer conductors.

In the illustrated embodiment, the outer shielding 303 is discontinuous in the middle of the common mode trap 300 to expose a portion of the dielectric spacer 304 which in some embodiments is provided along the entire length of the common mode trap 300. The dielectric spacer 304, may be comprised, as a non-limiting example, of Teflon or another dielectric material. The dielectric spacer 304 functions as a capacitor and thus may be tuned or configured to provide a desired resonance. It should be appreciated that other configurations for providing capacitance to the common mode trap 300 are possible, and that the illustrated configurations are exemplary and non-limiting. For example, discrete capacitors may alternatively be provided to the common mode trap 300.

Further, the common mode trap 300 includes a first post 313 and a second post (not shown) to which the first common mode trap conductor 307 and the second common mode trap conductor 309 are fixed. To that end, the first post 313 and the second post are positioned at the opposite ends of the common mode trap, and are fixed to the outer shielding 303. The first post 313 and the second post ensure that the first and second common mode trap conductors 307 and 309 are positioned close to the outer shielding 303 at the ends of the common mode trap 300, thereby providing a tapered butterfly configuration of the counterwound conductors as described further herein.

The tapered butterfly configuration includes a first loop formed by the first common mode trap conductor 307 and a second loop formed by the second common mode trap conductor 309, arranged so that an induced current (a current induced due to a magnetic field) in the first loop 307 and an induced current in the second loop 309 cancel each other out. For example, if the field is uniform and the first loop 307 and the second loop 309 have equal areas, the resulting net current will be zero. The tapered cylindrical arrangement of the loops 307 and 309 provide improved flexibility and consistency of resonant frequency during flexing relative to two-dimensional arrangements conventionally used in common mode traps.

Generally, a tapered butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with reference to FIG. 2, in some embodiments, counterwound conductors (e.g., conductors wound about a central member and/or axis in opposing spiral directions) may be spaced a distance radially from the central conductor 210 to form the common mode traps 212, 214, 216. As depicted in FIG. 3 and described further herein, the radial distance may be tapered towards the end of the common mode traps to reduce or altogether eliminate fringe effects. In this way, the common mode traps 212, 214, 216 may be continuously or contiguously positioned without substantial gaps therebetween.

Figure 4:
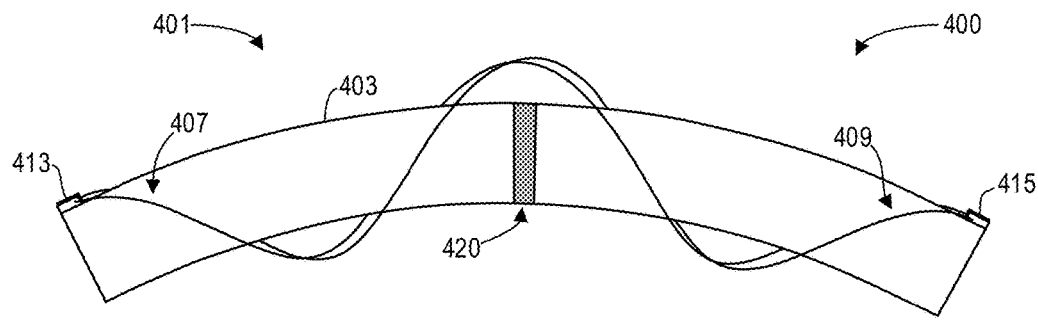
FIG. 4 is a side view of a common mode trap with two common mode trap conductors on a curved cable.

FIG. 4 is a side view 400 of a common mode trap 401 on a curved (i.e., flexed) cable or central conductor according to an embodiment of the disclosure. As depicted, the common mode trap 401 includes an outer sleeve or shielding 403 which wraps around a cable or central conductor (not shown). The common mode trap 401 includes a first common mode trap conductor 407 and a second common mode trap conductor 409, both of which are fixed to a first post 413 and a second post 415 respectively positioned at the a first and a second end of the common mode trap 401 as depicted. The first and second common mode trap conductors 407, 409 are counterwound around the sleeve or shield 403 in a tapered spiral configuration. The tapered spiral configuration is described further herein with regard to FIGS. 5-6.

In some embodiments, the shield 403 is discontinuous in the middle of the common mode trap 401 to expose the dielectric spacer 420 which may be disposed within the shield 403 along the length of the common mode trap 401, as described above. However, it should be appreciated that different configurations of a dielectric spacer are possible, and that the depicted configuration is exemplary and non-limiting.

Figure 5:
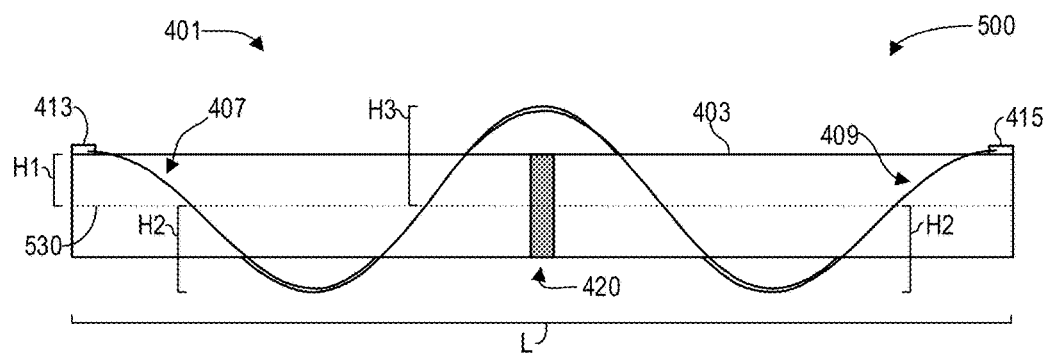
FIG. 5 is a side view of a common mode trap with two common mode trap conductors on a straight cable.

FIG. 5 is a side view 500 of the common mode trap 401 on a straight (i.e., non-flexed) cable or central conductor according to an embodiment of the disclosure. The common mode trap 401 has a length L.

Regarding the tapered spiral configuration, it should be noted that the first and second common mode trap conductors 407 and 409 are spaced at varying radial distances or heights from a central axis 530 of the common mode trap 401. In particular, the first and second common mode trap conductors 407 and 409 are spaced a radial distance or height H1 from the central axis 530 at the posts 413 and 415. As the first and second common mode trap conductors 407 and 409 wrap around the shield 403, the conductors cross orthogonally at a radial distance H2 from the central axis 530. Further, in the middle of the common mode trap 401 (i.e., near the gap wherein the dielectric spacer 420 is exposed), the first and second common mode traps 407 and 409 cross orthogonally at a radial distance H3 from the central axis 530.

The height H1 may be configured such that the first and second common mode trap conductors 407 and 409 are positioned at or substantially close to the shield 403, while the height H3 may be configured such that the first and second common mode trap conductors 407 and 409 are positioned a desired distance away from the shield 403 where the conductors cross orthogonally in the middle of the common mode trap 401. That is, the height H3 is substantially larger than the height H1.

Further, the height H2 of the first and second common mode trap conductors 407 and 409 where they cross orthogonally may be larger than the radial distance H1 and smaller than the radial distance H3. In this way, the spiral configuration of the first and second common mode trap conductors is tapered towards the ends of the common mode trap. However, in some examples, the height H2 and the height H3 may be equal, such that the tapering of the spiral between the orthogonal crossing of the conductors 407 and 409 at the height H2 and the posts 413 and 415 is steeper than if the height H2 is smaller than the height H3. Such a configuration may be desirable, as the impedance of the common mode trap 401 is greatest when the common mode trap conductors are spaced further away from the shield 403. However, it should be appreciated that the heights H1, H2, and H3 may be configured to obtain a desired impedance of the common mode trap 401 while reducing or eliminating fringe effects at the ends of the common mode trap 401.

Further, the two off-center crossings of the conductors are both shown at a same radial distance H2, such that the tapering of the spiral is symmetric about the center of the common mode trap. However, in some embodiments the off-center crossings may be positioned at different radial distances from the central axis, such that the tapering of the spiral is asymmetric.

The spiral topology of the common mode trap is based on two counter-rotating spirals. The first spiral may be wound around the common mode trap according to:

$$x_1(\varphi) = f(\varphi)\cos(\varphi),$$
$$y_1(\varphi) = f(\varphi)\sin(\varphi), \text{ and}$$
$$z_1(\varphi) = \frac{L}{4\pi}\varphi,$$

where $f(\varphi)$ represents the radius of the spiral at the azimuthal angle $\varphi$. Similarly, the second spiral may be wound around the common mode trap according to:

$$x_2(\varphi) = f(\varphi)\cos(\varphi),$$
$$y_2(\varphi) = -f(\varphi)\sin(\varphi), \text{ and}$$
$$z_1(\varphi) = \frac{L}{4\pi}\varphi.$$

According to the condition of orthogonality of the two spirals, in order to achieve the minimal mutual inductance between the spirals, the relationship between the length L of the common mode trap and its maximum radius $R_{max}$ is:

$$f(0) = \frac{L}{4\pi} = R_{max}.$$

If the function $f(\varphi)$ is a constant value, say $R_{max}$, along the entire common mode trap length L, then the common mode trap topology corresponds to prior approaches to common mode traps.

Further, the function $f(\varphi)$ may be chosen as a symmetric function. For example, the function $f(\varphi)$ may be symmetric about the center of the common mode trap with a tapering shape built-in between the minimum radius $R_{min}$ and the maximum radius $R_{max}$ along the common mode trap length L, defined as:

$$f(\varphi - \varphi_0) = R_{max} - \frac{(R_{max} - R_{min})}{(2\pi)^n}|\varphi - \varphi_0|^n,$$

where $\varphi_o$ comprises the azimuthal angle at which the spirals are at maximum radius (e.g., at the center of the common mode trap where the spirals cross), and where n comprises a tapering order. As n increases from 0, the tapering of the spirals towards the ends of the common mode trap becomes steeper. Thus, in the design of the common mode trap, the value of the tapering order n selected may be adjusted to selectively control the fringe field, and thus to increase the number of common mode traps per unit length of the cable or central conductor. Example common mode trap configurations with different tapering orders n are described further herein with regard to FIG. 15.

Figure 6:
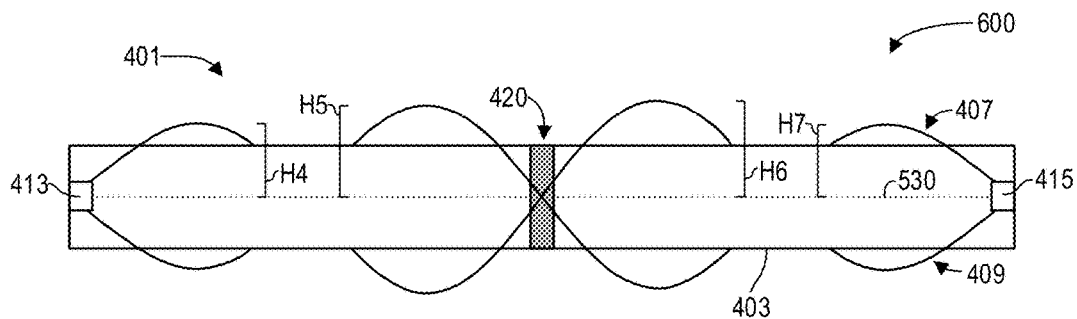
FIG. 6 is a top view of a common mode trap with two common mode trap conductors on a straight cable.

FIG. 6 is a top view 600 of the common mode trap 401 on a straight cable or central conductor according to an embodiment of the disclosure. The tapered spiral configuration of the first and second common mode trap conductors 407 and 409 is evident in the varying radial distances H4, H5, H6, and H7 of the first and second common mode trap conductors 407 and 409.

Closer to the post 413, the first and second common mode trap conductors 407 and 409 are spaced a radial distance H4 from the central axis 530 of the common mode trap 401. Meanwhile, closer to the orthogonal crossing of the conductors 407 and 409 near the exposed portion of the dielectric spacer 420, the first and second conductors 407 and 409 are spaced a radial distance H5 from the central axis 530 of the common mode trap 401. In some embodiments, the radial distance H4 is less than the radial distance H5. In this way, the spiral configuration of the first and second conductors 407 and 409 is tapered towards the post 413.

Similarly, towards the post 415, the first and second conductors are spaced a radial distance H7 from the central axis 530, while closer to the central crossing the conductors are spaced a radial distance H6 from the central axis 530. The radial distance H6 may be greater than the radial distance H7, thereby providing a tapering of the spiral configuration of the first and second conductors 407 and 409 towards the post 415.

In some embodiments, the radial distances H4 and H7 are equal, and the radial distances H5 and H6 are equal. In this way, the tapering of the conductors may be symmetric about the middle of the common mode trap 401. However, in other embodiments the radial distances may be differently configured such that the tapering of the spiral is asymmetric.

FIG. 7 is a perspective view 700 of a common mode trap 701 with four common mode trap conductors on a straight cable or central conductor 702 according to an embodiment of the invention. Specifically, common mode trap 701 includes common mode trap conductors 710, 711, 712, and 713. Similar to the common mode trap described hereinabove with regard to FIGS. 3-6, the common mode trap 701 may include a shield 703 at least partially enclosing the central conductor 702, as well as a dielectric spacer 704 which may, in some examples, be partially exposed as depicted.

As depicted, the common mode trap conductors are configured in counterwound pairs of common mode trap conductors. For example, common mode trap conductors 710 and 711 terminate at points 716 and 718, and are counterwound in a spiral configuration such that common mode trap conductor 711 is wound in a clockwise direction around the central conductor 702 while the common mode trap conductor 710 is wound in a counter-clockwise direction around the central conductor 702. The pair of common mode trap conductors 710 and 711 thus form a first common mode trap conductor pair 715. The first common mode trap conductor pair 715 thereby resembles and functions similarly to the pair of common mode trap conductors 407 and 409 of the common mode trap 401 described hereinabove. For example, the common mode trap conductors 710 and 711 cross orthogonally three times in the depicted spiral configuration.

Similarly, common mode trap conductors 712 and 713 terminate at points 717 and 719, and are counterwound in a spiral configuration such that common mode trap conductor 712 is wound in a clockwise direction around the central conductor 702 while common mode trap conductor 713 is wound in a counter-clockwise direction around the central conductor 702. The pair of common mode trap conductors 712 and 713 thus form a second common mode trap conductor pair 720.

The second common mode trap conductor pair 720 may be identical to the first common mode trap conductor pair 715, with the exception of being positioned opposite to the first common mode trap conductor pair 715. To that end, the termination points 716 and 718 are positioned on an opposite side of the central conductor 703 from the termination points 717 and 719.

It should be noted that the common mode trap 701 may be the same length L as the common mode trap 401 described hereinabove. In this way, the number of common mode trap conductors, herein also referred to as the density of the common mode trap, of the common mode trap 701 is double the density of the common mode trap 401 described hereinabove. In other words, the density of the common mode trap 701 is increased with respect to the density of the common mode trap 401. By increasing the density of the common mode trap, the mutual inductance of the common mode trap 701 with the central conductor 702 is increased. Specifically, the mutual inductance between the common mode trap 701 and the central conductor 702 is double the mutual inductance between the common mode trap 401 and the central conductor disposed therein. In turn, the common mode trap 701 provides a higher impedance on the central conductor 702, thereby improving the invisibility of the central conductor 702 to external electromagnetic radiation.

As depicted, the common mode trap pairs 715 and 720 are connected to the surface of the central conductor 702, which may be sheathed in a dielectric spacer 704 that provides capacitance to the conductors. Such a configuration, wherein the common mode trap conductors are symmetrically counterwound and directly connected to a dielectric spacer enclosing the central conductor, may be referred to herein as a connected flutter balun. Other configurations, such as a floating flutter balun wherein the common mode trap conductors are connected to capacitors or dielectric materials positioned away from the central conductor, are described further herein.

FIG. 8 is a perspective view 800 of a common mode trap 801 with eight common mode trap conductors on a straight cable or central conductor 802. Specifically, common mode trap 801 includes common mode trap conductors 810, 811, 812, 813, 820, 821, 822, and 823.

Similar to the common mode trap 701 described hereinabove, the common mode trap conductors 810, 811, 812, 813, 820, 821, 822, and 823 are configured in pairs. Specifically, common mode trap conductors 810 and 811 are counterwound in a spiral configuration as described hereinabove and thus form a first common mode trap conductor pair 816, while common mode trap conductors 812 and 813 are similarly counterwound in a spiral configuration and form a second common mode trap conductor pair 817. As depicted, the first common mode trap conductor pair 816 is positioned a first radial distance 807 away from the central axis of the central conductor 802, while the second common mode trap conductor pair 817 is positioned a second radial distance 808 away from the central axis of the central conductor 802, wherein the first radial distance 807 is greater than the second radial distance 808.

Similarly, common mode trap conductors 820 and 821 are counterwound in a spiral configuration and thus form a third common mode trap conductor pair 826, while common mode trap conductors 822 and 823 are counterwound in a spiral configuration and thus form a fourth common mode trap conductor pair 827. The third common mode trap conductor pair 826 is positioned the first radial distance 807 away from the central axis of the central conductor 802, while the fourth common mode trap conductor pair 827 is positioned the second radial distance 808 away from the central axis of the central conductor 802.

The common mode trap 801 thus includes four common mode trap conductor pairs symmetrically disposed about the central conductor 802. The density of the common mode trap 801 is therefore twice the density of the common mode trap 701 described hereinabove.

The common mode trap conductor pairs 816 and 817 terminate at a first capacitor 814 and a second capacitor 815 positioned at opposite ends of the common mode trap 801. Similarly, the common mode trap conductor pairs 826 and 827 terminate at a third capacitor 824 and a fourth capacitor 825 positioned at opposite ends of the common mode trap 801. The first and second capacitors 814 and 815 are positioned on opposite sides of the central conductor 802 from the third and fourth capacitors 824 and 825, as depicted.

Various methods for supporting the common mode trap conductors in the common mode traps described herein are available. For example, FIG. 9 is a perspective view 900 of a common mode trap 901 with eight common mode trap conductors mechanically supported by a plurality of annular disks or washers 910 on a straight cable or central conductor 902 according to an embodiment of the invention. The common mode trap 901 may be similar to the common mode trap 801 in that the common mode trap 901 may include four common mode trap conductor pairs (depicted as dashed lines), wherein two of the common mode trap conductor pairs are positioned a first radial distance away from the central axis of the central conductor 902 while the remaining two common mode trap conductor pairs are positioned a second, smaller radial distance away from the central axis of the central conductor 902.

The plurality of washers 910 includes a first washer 911, a second washer 912, a third washer 913, a fourth washer 914, a fifth washer 915, a sixth washer 916, a seventh washer 917, an eighth washer 918, and a ninth washer 919. As depicted, the plurality of washers 910 may be distributed evenly and regularly along the common mode trap 901. Each washer of the plurality of washers 910 may comprise an annular disk composed of a plastic material, as an illustrative and non-limiting example.

Furthermore, each washer includes a plurality of conductor apertures through which the common mode trap conductors may be threaded. To illustrate, FIG. 9 also includes a front view 930 of an example washer 931 with an inner radius 932 and an outer radius 933. Washer 931 defines a bore 934 through which a central conductor may be disposed. Furthermore, washer 931 includes a plurality of conductor apertures through which the common mode trap conductors may be threaded. Specifically, washer 931 includes a first pair of conductor apertures 935, a second pair of conductor apertures 936, a third pair of conductor apertures 937, and a fourth pair of conductor apertures 938.

As depicted, the first pair of conductor apertures 935 and the fourth pair of conductor apertures 938 may be oppositely positioned adjacent to the outer edge of the washer 931 defined by the outer radius 933, while the second pair of conductor apertures 936 and the third pair of conductor apertures 937 may be oppositely positioned adjacent to the inner edge of the washer 931 defined by the inner radius 932. With reference to the common mode trap conductor pairs described hereinabove with regard to FIG. 8, the common mode trap conductor pairs 816 and 826 at the first radial distance 807 may be threaded through the outer conductor apertures 935 and 938. Similarly, the common mode trap conductor pairs 817 and 827 at the second radial distance 808 may be threaded through the inner conductor apertures 936 and 937.

Each washer of the plurality of washers 910 may be rotated 90 degrees with respect to each adjacent washer. For example, washer 911 is positioned at the end of the common mode trap 901 with an orientation arbitrarily defined as zero degrees. Meanwhile, washer 912 is rotated 90 degrees with respect to washer 911 such that the conductor apertures of washer 912 are oriented 90 degrees with respect to the conductor apertures of washer 911. Further, washer 913 is rotated 90 degrees with respect to washer 912 such that the conductor apertures of washer 913 are oriented 90 degrees with respect to the conductor apertures of washer 912 but zero degrees with respect to the conductor apertures of washer 911. This rotated configuration is repeated for each washer of the plurality of washers 910, such that the washers 911, 913, 915, 917, and 919 are aligned in orientation with each other while washers 912, 914, 916, and 918 are aligned in orientation with each other. Each pair of conductor apertures is configured to enforce an orthogonal crossing of the common mode trap conductors threaded therethrough. In this way, the symmetry of the common mode trap configuration, and thus the effectiveness of the common mode trap with regard to countering external electromagnetic radiation, can be maintained while still providing flexibility of the common mode trap on a central conductor.

In some examples, floating capacitors (not shown) such as the capacitors 814, 815, 824, and 825 described hereinabove with regard to FIG. 8 may be embedded in the washers 911 and 919 positioned at the ends of the common mode trap 901. In other examples, the common mode trap 901 may comprise a connected flutter balun such that the common mode trap conductors are connected to a dielectric spacer (not shown) that sheathes the central conductor 802. Such examples are illustrative and non-limiting, and it should be appreciated that any suitable configuration for providing capacitance to the common mode trap 901 may be utilized.

The configuration of the plurality of washers, including the number of washers and the configuration of conductor apertures for each washer, may depend on the particular configuration of the common mode trap. For example, the plurality of washers 910 of the common mode trap 901 is configured to support the non-tapered spiral design of the common mode trap conductors, with two common mode trap conductor pairs positioned at different radial distances on two opposite sides of the common mode trap. However, in some examples, the common mode trap conductor pairs may be distributed differently around the central conductor. For example, four additional common mode trap conductor pairs identical to the four common mode trap conductor pairs depicted in FIGS. 7 and 8 may be positioned within the common mode trap and oriented 90 degrees with respect to the four common mode trap conductor pairs depicted in FIGS. 7 and 8, such that the common mode trap includes 16 common mode trap conductors (eight common mode trap conductors at the first radial distance, and eight common mode trap conductors at the second radial distance). Each washer may thus include eight additional conductor apertures distributed appropriately to accommodate the additional common mode trap conductor pairs.

Further still, in some examples, the common mode trap conductors may be tapered towards the ends of the common mode trap as described hereinabove with regard to FIGS. 5 and 6. In such examples, the inner and outer radii of one or more washers of the plurality of washers may be adjusted to accommodate the tapering of the radial distances of the common mode trap conductors along the length of the common mode trap.

Another method for mechanically supporting or forming the common mode trap conductors is to integrate the common mode trap conductors and, in some examples, the corresponding floating capacitors in a PVC-like hose, ideally comprising Teflon. A central conductor or cable may be easily disposed within the hose to provide the common mode trap to the central conductor. The hose may be flexible to allow bending of the central conductor without interfering with the functioning of the common mode trap. Yet another method for forming the common mode trap conductors is to braid the wire around a sleeve that may be placed upon the central conductor. Another method may include providing posts coupled to the shielding to which the common mode trap conductors are coupled, as described hereinabove with regard to FIGS. 4-6.

FIG. 10 shows a top view 1000 of a common mode trap 1001 with eight common mode trap conductors on a straight cable or central conductor 1002 according to an embodiment of the invention. FIG. 11 shows a cross-sectional view 1100 of one end of the common mode trap 1001 according to an embodiment.

Common mode trap 1001 includes four posts positioned at each end of the common mode trap 1001. As depicted in the cross-sectional view 1100, for example, the posts 1010, 1020, 1030, and 1040 are regularly distributed around the circumference of the central conductor 1002 at a first end of the common mode trap 1001; similarly, posts 1011, 1021, and 1031 corresponding respectively to the posts 1010, 1020, and 1030, as well as an eighth post (not shown)

corresponding to the post 1040 are regularly distributed around the circumference of the central conductor 1002 at a second, opposite end of the common mode trap 1001 as depicted in the top view 1000.

Two common mode trap conductors are fixed to each post of the common mode trap 1001. For example, a first common mode trap conductor 1012 and a second common mode trap conductor 1013 are fixed to the first post 1010, spiral around the central conductor 1002 along the length of the common mode trap 1001, and are fixed to the second post 1011. A third common mode trap conductor 1022 and a fourth common mode trap conductor 1023 are fixed to the third post 1020 at a first end of the common mode trap 1001, spiral around the central conductor 1002 along the length of the common mode trap 1001, and are fixed to the fourth post 1021 at the second, opposite end of the common mode trap 1001 as depicted. A fifth common mode trap conductor 1032 and a sixth common mode trap conductor 1033 are fixed to the fifth post 1030 at the first end, and fixed to the sixth post 1031 at the second end. A seventh common mode trap conductor 1042 and an eighth common mode trap conductor 1043 are fixed to the seventh post 1040, and fixed to the eighth post at the second end. As described hereinabove and depicted in FIG. 10, each pair of common mode trap conductors are counterwound in a spiral configuration. Additionally, in some examples, the common mode trap conductors may be tapered towards the first and second ends, though it should be appreciated that in other examples, the common mode trap conductors may maintain a constant radial distance from the central axis of the central conductor 1002 throughout the length of the common mode trap 1001.

In some examples, the density of a common mode trap may be increased with respect to the density of the common mode traps described hereinabove. For example, FIG. 12 shows a cross-sectional view 1200 of one end of a common mode trap 1201 with sixteen common mode trap conductors on a central conductor 1202 according to an embodiment. Similar to the common mode traps 801 and 901 described hereinabove, common mode trap 1201 includes multiple common mode trap conductor pairs coupled to capacitors in a floating configuration. However, in contrast with the common mode traps 801 and 901, common mode trap 1201 includes two additional capacitors at each end of the common mode trap, which are regularly distributed around the circumference of the common mode trap, similar to the distribution of the posts of common mode trap 1001. Common mode trap 1201 thus includes eight capacitors, including a first capacitor 1210, a second capacitor 1220, a third capacitor 1230, and a fourth capacitor 1240, as well as corresponding capacitors (not shown) at the opposite end (not shown) of the common mode trap 1201.

As depicted, two pairs of common mode trap conductors are fixed to each capacitor, including a first common mode trap conductor pair at a first radial distance from the central axis of the central conductor 1202 and a second common mode trap conductor pair at a second radial distance from the central axis of the central conductor 1202, wherein the first and second radial distances are different. For example, a first common mode trap conductor 1212 is fixed to the first capacitor 1210 and spirals clockwise around the central conductor 1202 along the length of the common mode trap 1201 at a first radial distance, while a second common mode trap conductor 1213 is fixed to the first capacitor 1210 and spirals counter-clockwise around the central conductor 1202 along the length of the common mode trap 1201 at the first radial distance. First common mode trap conductor 1212 and second common mode trap conductor 1213 thus form a first common mode trap conductor pair. Meanwhile, a third common mode trap conductor 1214 is fixed to the first capacitor 1210 and spirals clockwise around the central conductor 1202 along the length of the common mode trap 1201 at a second radial distance greater than the first radial distance, while a fourth common mode trap conductor 1215 is fixed to the first capacitor 1210 and spirals counter-clockwise around the central conductor 1202 along the length of the common mode trap 1201 at the second radial distance. Third common mode trap conductor 1214 and fourth common mode trap conductor 1215 thus form a second common mode trap conductor pair.

Similarly, a fifth common mode trap conductor 1222 and a sixth common mode trap conductor 1223 are fixed to the second capacitor 1220, thereby forming a third common mode trap conductor pair that spirals in a counterwound configuration along the length of the common mode trap 1201 at the first radial distance. Meanwhile, a seventh common mode trap conductor 1224 and an eighth common mode trap conductor 1225 are fixed to the second capacitor 1220, thereby forming a fourth common mode trap conductor pair that spirals in a counterwound configuration along the length of the common mode trap 1201 at the second radial distance. Further, a ninth common mode trap conductor 1232 and a tenth common mode trap conductor 1233 are fixed to the third capacitor 1230, thereby forming a fifth common mode trap conductor pair that spirals in a counterwound configuration along the length of the common mode trap 1201 at the first radial distance. Meanwhile, an eleventh common mode trap conductor 1234 and a twelfth common mode trap conductor 1235 are fixed to the third capacitor 1230, thereby forming a sixth common mode trap conductor pair that spirals in a counterwound configuration along the length of the common mode trap 1201 at the second radial distance. Further still, a thirteenth common mode trap conductor 1242 and a fourteenth common mode trap conductor 1243 are fixed to the fourth capacitor 1240, thereby forming a seventh common mode trap conductor pair that spirals in a counterwound configuration along the length of the common mode trap 1201 at the first radial distance. Meanwhile, a fifteenth common mode trap conductor 1244 and a sixteenth common mode trap conductor 1245 are fixed to the fourth capacitor 1240, thereby forming an eighth common mode trap conductor pair that spirals in a counterwound configuration along the length of the common mode trap 1201 at the second radial distance. Similar to the examples described hereinabove, each common mode trap conductor pair is fixed to a corresponding capacitor (not shown) at the opposite end of the common mode trap 1201.

In this way, the density of the common mode trap 1201 may comprise sixteen common mode trap conductors, and the mutual inductance between the common mode trap and the central conductor is increased with respect to common mode traps with a lower density. However, the mutual inductance between a common mode trap and a central conductor does not increase linearly with the density of the common mode trap. Instead, the improvement in mutual inductance begins to taper off as the density increases. Thus, there is a tradeoff between an increase in mutual inductance and the complexity of higher-density common mode traps, as it becomes more difficult to maintain symmetry between the common mode trap conductor pairs as more common mode trap conductor pairs are added to the common mode trap.

FIG. 13 is a high-level block diagram illustrating an example method 1300 for a common mode trap according to an embodiment of the invention. Method 1300 begins at

1305. At 1305, method 1300 includes providing a central conductor. The central conductor may be configured, for example, generally similarly to the central conductor 210 described herein above. For example, the central conductor may comprise a transmission cable of an MRI machine configured to couple an RF coil to one or more processing elements.

At 1310, method 1300 includes disposing a dielectric spacer about the central conductor. Specifically, the dielectric spacer may be disposed radially about the central conductor and may extend along at least a portion of the length of the central conductor. For example, the dielectric spacer may have a through-hole or bore pre-formed therethrough that is sized to accept the central conductor, and may be secured in place to an outer sleeve of the central conductor at one or more locations. The dielectric spacer may be configured, for example, generally similarly to the dielectric spacer 304 described herein above. Further, an outer sleeve or shielding may be provided about the dielectric spacer. In some examples, the outer sleeve may be discontinuous to expose at least a portion of the dielectric spacer.

At 1315, method 1300 includes wrapping two common mode trap conductors in countering directions about the dielectric spacer with a radial distance to form a first common mode trap conductor pair on a first side of the central conductor. Specifically, a first common mode trap conductor may be wrapped in a spiral about the dielectric spacer in a first direction (e.g., clockwise) with a radial distance that may or may not be tapered, while a second common mode trap conductor may be wrapped in a spiral about the dielectric spacer in a second direction (e.g., counter-clockwise) with a radial distance that may or may not be tapered. Each end of the common mode trap conductors may be fixed to a post or capacitor positioned at each end of the common mode trap, as an illustrative and non-limiting example. Note that as depicted in the examples described herein, a "side" of the cylindrical central conductor may be understood as an axis parallel to the central axis of the central conductor that extends along the outer surface of the central conductor. The first and second common mode trap conductors may comprise, as a non-limiting example, a ribbon conductor or a wire. The spiral form of the first common mode trap conductor may be tapered such that the ends of the first and second common mode trap conductors are substantially close to the ends of the dielectric spacer, while the middle of the first common mode trap conductor is spaced a radial distance away from the dielectric spacer.

At 1320, method 1300 includes wrapping two common mode trap conductors in countering directions about the dielectric spacer with a radial distance to form a second common mode trap conductor pair on a second side of the central conductor opposite to the first side. Specifically, a third common mode trap conductor may be wrapped about the dielectric spacer in the first direction with a tapered or non-tapered radial distance, while a fourth common mode trap conductor may be wrapped about the dielectric spacer in the second direction with a tapered or non-tapered radial distance. For example, the fourth common mode trap conductor may be wrapped in a spiral having a similar pitch to a spiral defined by the third common mode trap conductor, but in a different direction (e.g., clockwise versus counter-clockwise). It should be noted that the first and second common mode trap conductors as well as the third and fourth common mode trap conductors may be wrapped sufficiently loosely about the dielectric spacer so that the common mode trap conductors will not bind or couple to each other if the central conductor and dielectric spacer are bent or flexed. The spirals formed by the second common mode trap conductor pair may be tapered as described herein above.

At 1325, method 1300 includes coupling the transmission cable formed by the central conductor, dielectric spacer, and first and second common mode trap conductor pairs, to components of an MRI system within a bore of the MRI system. For example, the transmission cable is coupled to at least one processing component of the MRI system (e.g., the T/R switch and/or the data acquisition system) and an RF coil. In particular, one end of the transmission cable is connected to the processing component and the other end of the transmission cable is connected to the RF coil. Accordingly, the transmission cable may be used, for example, to transmit signals from a receive coil to the processing component for use in image reconstruction. As another example, the transmission cable is disposed within, or as a part of, the RF coil. Method 1300 may then end.

As another example, FIG. 14 is a high-level block diagram illustrating an example method 1400 for a common mode trap according to an embodiment of the invention. Method 1400 begins at 1405. At 1405, method 1400 includes providing a central conductor. The central conductor may be configured, for example, generally similarly to the central conductor 210 described herein above. For example, the central conductor may comprise a transmission cable of an MRI machine configured to couple an RF coil to one or more processing elements.

At 1410, method 1400 includes disposing four capacitors about the central conductor. Specifically, two capacitors may be disposed on opposite sides of the central conductor at each end of the common mode trap, for example, as described hereinabove with regard to FIG. 8.

At 1415, method 1400 includes wrapping two common mode trap conductors in countering directions about the central conductor with a first radial distance to form a first common mode trap conductor pair on a first side of the central conductor. Specifically, a first common mode trap conductor may be wrapped in a spiral about the central conductor in a first direction (e.g., clockwise) with a first radial distance that may or may not be tapered, while a second common mode trap conductor may be wrapped in a spiral about the central conductor in a second direction (e.g., counter-clockwise) with the first radial distance that may or may not be tapered. The ends of the common mode trap conductors may be fixed to a first capacitor positioned at one end of the common mode trap as well as to a second capacitor positioned at the other end of the common mode trap, as an illustrative and non-limiting example. The first and second common mode trap conductors may comprise, as a non-limiting example, a ribbon conductor or a wire. The spiral form of the first and second common mode trap conductors may be tapered such that the ends of the first and second common mode trap conductors are substantially close to the ends of the dielectric spacer, while the middle of the first and second common mode trap conductor is spaced a radial distance away from the dielectric spacer.

At 1420, method 1400 includes wrapping two common mode trap conductors in countering directions about the central conductor with a second radial distance greater than the first radial distance to form a second common mode trap conductor pair on the first side of the central conductor. Specifically, a third common mode trap conductor may be wrapped about the central conductor in the first direction with a tapered or non-tapered radial distance, while a fourth common mode trap conductor may be wrapped about the central conductor in the second direction with a tapered or non-tapered radial distance. For example, the fourth common mode trap conductor may be wrapped in a spiral having a similar pitch to a spiral defined by the third common mode trap conductor, but in a different direction (e.g., clockwise versus counterclockwise). The third and fourth common mode trap conductors are coupled to the first and second capacitors. It should be noted that the first and second common mode trap conductors as well as the third and fourth common mode trap conductors may be wrapped sufficiently loosely about the dielectric spacer so that the common mode trap conductors will not bind or couple to each other if the central conductor and dielectric spacer are bent or flexed. The spirals formed by the second common mode trap conductor pair may be tapered as described herein above.

At 1425, method 1400 includes wrapping two common mode trap conductors in countering directions about the central conductor with the first radial distance to form a third common mode trap conductor pair coupled to the third and fourth capacitors on a second side of the central conductor opposite to the first side.

Similarly, at 1430, method 1400 includes wrapping two common mode trap conductors in countering directions about the central conductor with the second radial distance to form a fourth common mode trap conductor pair coupled to the third and fourth capacitors on the second side of the central conductor.

At 1435, method 1400 includes coupling the transmission cable formed by the central conductor, the capacitors, and common mode trap conductor pairs, to components of an MRI system within a bore of the MRI system. For example, the transmission cable is coupled to at least one processing component of the MRI system (e.g., the T/R switch and/or the data acquisition system) and an RF coil. In particular, one end of the transmission cable is connected to the processing component and the other end of the transmission cable is connected to the RF coil. Accordingly, the transmission cable may be used, for example, to transmit signals from a receive coil to the processing component for use in image reconstruction. As another example, the transmission cable is disposed within, or as a part of, the RF coil. Method 1400 may then end.

The technical effect of the disclosure may include improved performance of MRI systems due to reduced interaction between transmission cables and coil elements. Another technical effect of the disclosure may include improved heat distribution, for example by distributing heat generated by common mode traps over a larger area and/or reducing, minimizing, or preventing hot spots. Yet another technical effect of the disclosure may include ensuring that common mode blocking or trapping is provided at all appropriate locations along a transmission cable. Another technical effect of the disclosure may include the improved flexibility of common mode trap assemblies. Yet another technical effect of the disclosure may include the rotation of common mode traps with respect to each other. Another technical effect of the disclosure may include the tapering of common mode trap conductors. Yet another technical effect of the disclosure may include the improved mutual inductance between common mode trap assemblies and central conductors.

In one embodiment, a common mode trap for a magnetic resonance imaging (MRI) apparatus comprises: a first conductor and a second conductor counterwound around a length of a central conductor, wherein the first and the second conductors are radially spaced a first distance from the central conductor, wherein the first and second conductors are fixed to a first side of the central conductor; and a third conductor and a fourth conductor counterwound around the length of the central conductor, wherein the third and fourth conductors are radially spaced the first distance from the central conductor, and wherein the third and fourth conductors are fixed to a second side of the central conductor opposite the first side.

In a first example of the common mode trap, the first and the second conductors cross paths orthogonally. In a second example of the common mode trap optionally including the first example, the common mode trap further comprises a dielectric spacer disposed radially about the central conductor along the length, wherein the first, second, third, and fourth conductors are counterwound around the dielectric spacer. In a third example of the common mode trap optionally including one or more of the first and second examples, the common mode trap further comprises a first and a second capacitor positioned at each end of the length along the first side, and a third and a fourth capacitor positioned at each end of the length along the second side, wherein the first and the second conductors are fixed to the first and the second capacitors, and wherein the third and the fourth conductors are fixed to the third and the fourth capacitors. In a fourth example of the common mode trap optionally including one or more of the first through third examples, the common mode trap further comprises: a fifth conductor and a sixth conductor counterwound around the length of the central conductor, wherein the fifth and the sixth conductors are radially spaced a second distance from the central conductor greater than the first distance, wherein the first and second conductors are fixed to the first and the second capacitors on the first side of the central conductor; and a seventh conductor and an eighth conductor counterwound around the length of the central conductor, wherein the seventh and eighth conductors are radially spaced the second distance from the central conductor, and wherein the seventh and eighth conductors are fixed to the third and the fourth capacitors on the second side of the central conductor. In a fifth example of the common mode trap optionally including one or more of the first through fourth examples, the common mode trap further comprises a fifth and a sixth capacitor positioned at each end of the length along a third side equidistant from the first and second sides, and a seventh and an eighth capacitor positioned at each end of the length along a fourth side positioned opposite the third side and equidistant from the first and second sides. In a sixth example of the common mode trap optionally including one or more of the first through fifth examples, the common mode trap further comprises a fifth conductor and a sixth conductor counterwound around the length of the central conductor, wherein the fifth and the sixth conductors are radially spaced the first distance from the central conductor, wherein the fifth and sixth conductors are fixed to the fifth and the sixth capacitors on the third side of the central conductor; and a seventh conductor and an eighth conductor counterwound around the length of the central conductor, wherein the seventh and eighth conductors are radially spaced the first distance from the central conductor, and wherein the seventh and eighth conductors are fixed to the seventh and the eighth capacitors on the fourth side of the central conductor. In a seventh example of the common mode trap optionally including one or more of the first through sixth examples, the common mode trap is tuned to provide a resonant frequency near an operating frequency of the MRI system. In an eighth example of the common mode trap optionally including one or more of the first through seventh examples, the common mode trap further comprises a plurality of annular disks disposed about the central conductor at regular intervals, wherein each of the conductors is threaded through each annular disk of the plurality of annular disks.

In another embodiment, a common mode trap assembly for a magnetic resonance imaging (MRI) system comprises: a central conductor with a length and configured to transmit a signal between an MRI radio frequency coil and a processing element of the MRI system; and a plurality of common mode traps extending along at least a portion of the length of the central conductor, the common mode traps configured to provide an impedance to reduce transmitter-driven currents of the MRI system, wherein each of the common mode traps comprises a second length and includes a plurality of conductor pairs, each conductor pair of the plurality of conductor pairs comprising a first conductor and a second conductor counterwound around the central conductor.

In a first example of the common mode trap assembly, each of the common mode traps includes a first plurality of capacitors positioned at a first end of the common mode trap and a second plurality of capacitors positioned at a second end of the common mode trap, wherein the first and second common mode trap conductors of the common mode trap are fixed to the first plurality of capacitors and the second plurality of capacitors. In a second example of the common mode trap assembly optionally including the first example, for each conductor pair of the plurality of conductor pairs, the first conductor and the second conductor cross paths orthogonally. In a third example of the common mode trap assembly optionally including one or more of the first and second examples, each of the plurality of common mode traps are disposed contiguously. In a fourth example of the common mode trap assembly optionally including one or more of the first through third examples, each of the common mode traps includes a dielectric spacer disposed radially about the central conductor.

In yet another embodiment, a method for providing a transmission cable for a radio frequency (RF) coil of a magnetic resonance imaging (MRI) system comprises: providing a central conductor of a length and configured to transmit a signal between the RF coil and a processing element of the MRI system; and positioning a plurality of common mode trap conductor pairs around the central conductor along at least a portion of the length of the central conductor, wherein the plurality of common mode trap conductor pairs are distributed symmetrically about the central conductor, wherein each common mode trap conductor pair includes a first common mode trap conductor wrapped in a spiral in a first direction about the central conductor along the portion of the length of the central conductor, and a second common mode trap conductor wrapped in a spiral in a second direction opposite to the first direction about the central conductor along the portion of the length.

In a first example of the method, a first half of the plurality of common mode trap conductor pairs are positioned a first radial distance from a central axis of the central conductor, and a second half of the plurality of common mode trap conductor pairs are positioned a second radial distance from the central axis, the second radial distance greater than the first radial distance. In a second example of the method optionally including the first example, the first and the second common mode trap conductors are positioned a first distance radially from a central axis of the central conductor at a midpoint of the length and a second distance radially from the central axis at each end of the length, the second distance less than the first distance. In a third example of the method optionally including one or more of the first and second examples, the first and the second common mode trap conductors are fixed to posts positioned at a first and a second end of the length. In a fourth example of the method optionally including one or more of the first through third examples, the method further comprises providing a dielectric spacer radially along the length of the central conductor, and coupling the plurality of common mode trap conductor pairs to the dielectric spacer. In a fifth example of the method optionally including one or more of the first through fourth examples, the method further comprises providing a shielding radially around the dielectric spacer.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A common mode trap for a magnetic resonance imaging (MRI) apparatus, comprising:
   a first conductor and a second conductor counterwound around a length of a central conductor, wherein the first and the second conductors are radially spaced a first distance from the central conductor, wherein the first and second conductors are fixed to a first side of the central conductor; and
   a third conductor and a fourth conductor counterwound around the length of the central conductor, wherein the third and fourth conductors are radially spaced the first distance from the central conductor, and wherein the third and fourth conductors are fixed to a second side of the central conductor opposite the first side.

2. The common mode trap of claim 1, wherein the first and the second conductors cross paths orthogonally.

3. The common mode trap of claim 1, further comprising a dielectric spacer disposed radially about the central conductor along the length, wherein the first, second, third, and fourth conductors are counterwound around the dielectric spacer.

4. The common mode trap of claim 1, further comprising a first and a second capacitor positioned at each end of the length along the first side, and a third and a fourth capacitor positioned at each end of the length along the second side, wherein the first and the second conductors are fixed to the first and the second capacitors, and wherein the third and the fourth conductors are fixed to the third and the fourth capacitors.

5. The common mode trap of claim 4, further comprising:
a fifth conductor and a sixth conductor counterwound around the length of the central conductor, wherein the fifth and the sixth conductors are radially spaced a second distance from the central conductor greater than the first distance, wherein the first and second conductors are fixed to the first and the second capacitors on the first side of the central conductor; and
a seventh conductor and an eighth conductor counterwound around the length of the central conductor, wherein the seventh and eighth conductors are radially spaced the second distance from the central conductor, and wherein the seventh and eighth conductors are fixed to the third and the fourth capacitors on the second side of the central conductor.

6. The common mode trap of claim 4, further comprising a fifth and a sixth capacitor positioned at each end of the length along a third side equidistant from the first and second sides, and a seventh and an eighth capacitor positioned at each end of the length along a fourth side positioned opposite the third side and equidistant from the first and second sides.

7. The common mode trap of claim 6, further comprising:
a fifth conductor and a sixth conductor counterwound around the length of the central conductor, wherein the fifth and the sixth conductors are radially spaced the first distance from the central conductor, wherein the fifth and sixth conductors are fixed to the fifth and the sixth capacitors on the third side of the central conductor; and
a seventh conductor and an eighth conductor counterwound around the length of the central conductor, wherein the seventh and eighth conductors are radially spaced the first distance from the central conductor, and wherein the seventh and eighth conductors are fixed to the seventh and the eighth capacitors on the fourth side of the central conductor.

8. The common mode trap of claim 1, wherein the common mode trap is tuned to provide a resonant frequency near an operating frequency of the MRI system.

9. The common mode trap of claim 1, further comprising a plurality of annular disks disposed about the central conductor at regular intervals, wherein each of the conductors is threaded through each annular disk of the plurality of annular disks.

10. A common mode trap assembly for a magnetic resonance imaging (MRI) system, comprising:
a central conductor with a length and configured to transmit a signal between an MRI radio frequency coil and a processing element of the MRI system; and
a plurality of common mode traps extending along at least a portion of the length of the central conductor, the common mode traps configured to provide an impedance to reduce transmitter-driven currents of the MRI system, wherein each of the common mode traps comprises a second length and includes a plurality of conductor pairs, each conductor pair of the plurality of conductor pairs comprising a first conductor and a second conductor counterwound around the central conductor.

11. The common mode trap assembly of claim 10, wherein each of the common mode traps includes a first plurality of capacitors positioned at a first end of the common mode trap and a second plurality of capacitors positioned at a second end of the common mode trap, wherein the first and second common mode trap conductors of the common mode trap are fixed to the first plurality of capacitors and the second plurality of capacitors.

12. The common mode trap assembly of claim 10, wherein for each conductor pair of the plurality of conductor pairs, the first conductor and the second conductor cross paths orthogonally.

13. The common mode trap assembly of claim 10, wherein each of the plurality of common mode traps are disposed contiguously.

14. The common mode trap assembly of claim 10, wherein each of the common mode traps includes a dielectric spacer disposed radially about the central conductor.

15. A method for providing a transmission cable for a radio frequency (RF) coil of a magnetic resonance imaging (MRI) system, comprising:
providing a central conductor of a length and configured to transmit a signal between the RF coil and a processing element of the MRI system; and
positioning a plurality of common mode trap conductor pairs around the central conductor along at least a portion of the length of the central conductor, wherein the plurality of common mode trap conductor pairs are distributed symmetrically about the central conductor, wherein each common mode trap conductor pair includes a first common mode trap conductor wrapped in a spiral in a first direction about the central conductor along the portion of the length of the central conductor, and a second common mode trap conductor wrapped in a spiral in a second direction opposite to the first direction about the central conductor along the portion of the length.

16. The method of claim 15, wherein a first half of the plurality of common mode trap conductor pairs are positioned a first radial distance from a central axis of the central conductor, and wherein a second half of the plurality of common mode trap conductor pairs are positioned a second radial distance from the central axis, the second radial distance greater than the first radial distance.

17. The method of claim 15, wherein the first and the second common mode trap conductors are positioned a first distance radially from a central axis of the central conductor at a midpoint of the length and a second distance radially from the central axis at each end of the length, the second distance less than the first distance.

18. The method of claim 15, wherein the first and the second common mode trap conductors are fixed to posts positioned at a first and a second end of the length.

19. The method of claim 15, further comprising providing a dielectric spacer radially along the length of the central conductor, and coupling the plurality of common mode trap conductor pairs to the dielectric spacer.

20. The method of claim 19, further comprising providing a shielding radially around the dielectric spacer.

* * * * *